(12) United States Patent
Fehrer et al.

(10) Patent No.: US 8,441,004 B2
(45) Date of Patent: May 14, 2013

(54) RADIATION EMITTING DEVICE AND METHOD FOR THE PRODUCTION THEREOF

(75) Inventors: Michael Fehrer, Bad Abbach (DE); Karsten Heuser, Erlangen (DE); Egbert Höfling, Regensburg (DE); Tilman Schlenker, Nittendorf (DE); Andrew Ingle, Allershausen (DE); Michael Popp, München (DE); Markus Klein, Tegernheim (DE); Nina Riegel, Tegeinheim (DE); Günter Schmid, Hemohofen (DE); Ralf Krause, Dresden (DE); Stefan Seidel, Nittendorf (DE); Fryderyk Kozlowski, Erlangen (DE); Arvid Hunze, Erlangen (DE); Günter Gieres, Kleinsendelbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 352 days.

(21) Appl. No.: 12/680,190

(22) PCT Filed: Sep. 25, 2008

(86) PCT No.: PCT/EP2008/062864

§ 371 (c)(1),
(2), (4) Date: Sep. 2, 2010

(87) PCT Pub. No.: WO2009/040401

PCT Pub. Date: Apr. 2, 2009

(65) Prior Publication Data

US 2010/0314648 A1    Dec. 16, 2010

(30) Foreign Application Priority Data

Sep. 25, 2007 (DE) .......................... 10 2007 045 753
Dec. 3, 2007 (DE) .......................... 10 2007 058 005

(51) Int. Cl.
H01L 29/08 (2006.01)
H01L 35/24 (2006.01)
H01L 51/00 (2006.01)

(52) U.S. Cl.
USPC ............................. 257/40; 257/101; 257/102

(58) Field of Classification Search ............ 257/79–103, 257/40
See application file for complete search history.

(56) References Cited

U.S. PATENT DOCUMENTS 6,023,073 A    2/2000    Strite
6,717,358 B1   4/2004    Liao et al.
(Continued)

FOREIGN PATENT DOCUMENTS

CN    101030625    9/2007
DE    103 41 756    4/2004
(Continued)

OTHER PUBLICATIONS

G. Schwartz et al., "High efficiency organic light emitting diodes combining fluorescent and phosphorescent emitter systems", Organic Optoelectronics and Photonics II, Proc. of SPIE, vol. 6192, pp. 61920Q-1-61920Q-6, 2006.

(Continued)

Primary Examiner — Telly Green
(74) Attorney, Agent, or Firm — Cozen O'Connor

(57) ABSTRACT

A radiation-emitting device with a first electrode, a first emission layer, a second emission layer and a second electrode. The invention additionally relates to a method of producing a radiation-emitting device.

18 Claims, 9 Drawing Sheets

U.S. PATENT DOCUMENTS

| | | | |
|---|---|---|---|
| 6,750,609 | B2 | 6/2004 | Aziz et al. |
| 6,876,144 | B2 | 4/2005 | Peng |
| 6,987,356 | B2 | 1/2006 | Park |
| 7,037,601 | B2 | 5/2006 | Hatwar |
| 7,157,153 | B2 | 1/2007 | Yamada et al. |
| 7,211,336 | B2 | 5/2007 | Igarashi et al. |
| 7,572,522 | B2 | 8/2009 | Seo et al. |
| 2002/0055015 | A1 | 5/2002 | Sato et al. |
| 2002/0187367 | A1 | 12/2002 | Sakaguchi |
| 2004/0104394 | A1 | 6/2004 | Lin et al. |
| 2005/0194892 | A1 | 9/2005 | Lu |
| 2005/0221121 | A1 | 10/2005 | Ishihara et al. |
| 2006/0158104 | A1 | 7/2006 | Iijima et al. |
| 2007/0013297 | A1* | 1/2007 | Park .................. 313/504 |
| 2008/0203406 | A1 | 8/2008 | He et al. |
| 2008/0265751 | A1 | 10/2008 | Smith et al. |
| 2010/0176389 | A1* | 7/2010 | Chun et al. ............. 257/40 |

FOREIGN PATENT DOCUMENTS

| | | |
|---|---|---|
| DE | 11 2005 00 2603 | 8/2007 |
| DE | 11 2005 001 923 | 9/2007 |
| DE | 102 25 389 | 2/2008 |
| EP | 1 388 904 | 7/2003 |
| EP | 1 670 083 | 6/2006 |
| EP | 1 986 473 | 10/2008 |
| JP | 2002-100478 | 4/2002 |
| JP | 2002-313583 | 10/2002 |
| JP | 2005-285708 | 10/2005 |
| JP | 2006-24711 | 1/2006 |
| JP | 2006-172762 | 6/2006 |
| WO | WO 00/33396 | 6/2000 |
| WO | WO 2005/115059 | 12/2005 |
| WO | WO 2006/015567 | 2/2006 |
| WO | WO 2006/028546 | 3/2006 |
| WO | WO 2006/078005 | 7/2006 |
| WO | WO 2006/113106 | 10/2006 |
| WO | WO 2006/130883 | 12/2006 |

OTHER PUBLICATIONS

G. Schwartz et al., "Highly efficient white organic light emitting diodes comprising an interlayer to separate fluorescent and phosphorescent regions", Applied Physics Letters, vol. 89, pp. 083509-1-083509-3, 2006.

Y. Kim et al., "Accelerated pre-oxidation method for healing progressive electrical short in organic light-emitting devices", Applied Physics Letters, vol. 82, No. 14, pp. 2200-2202, 2003.

* cited by examiner

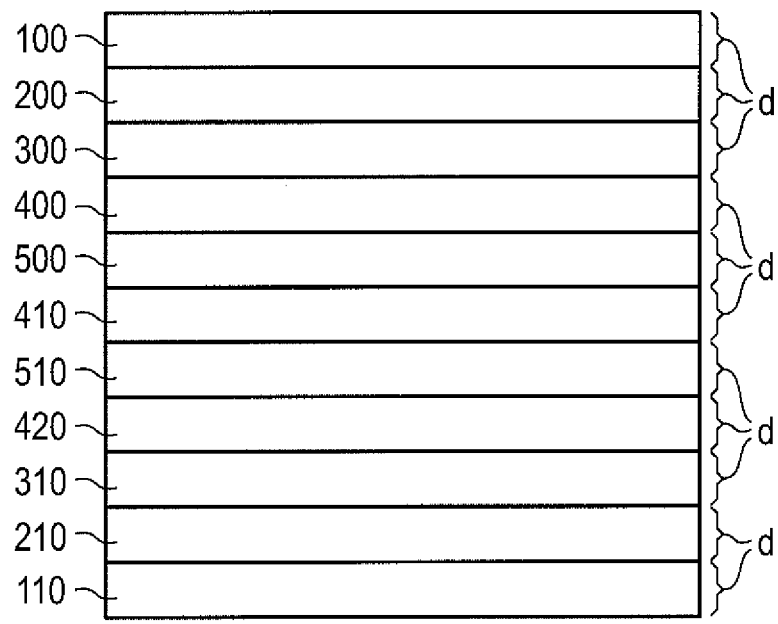

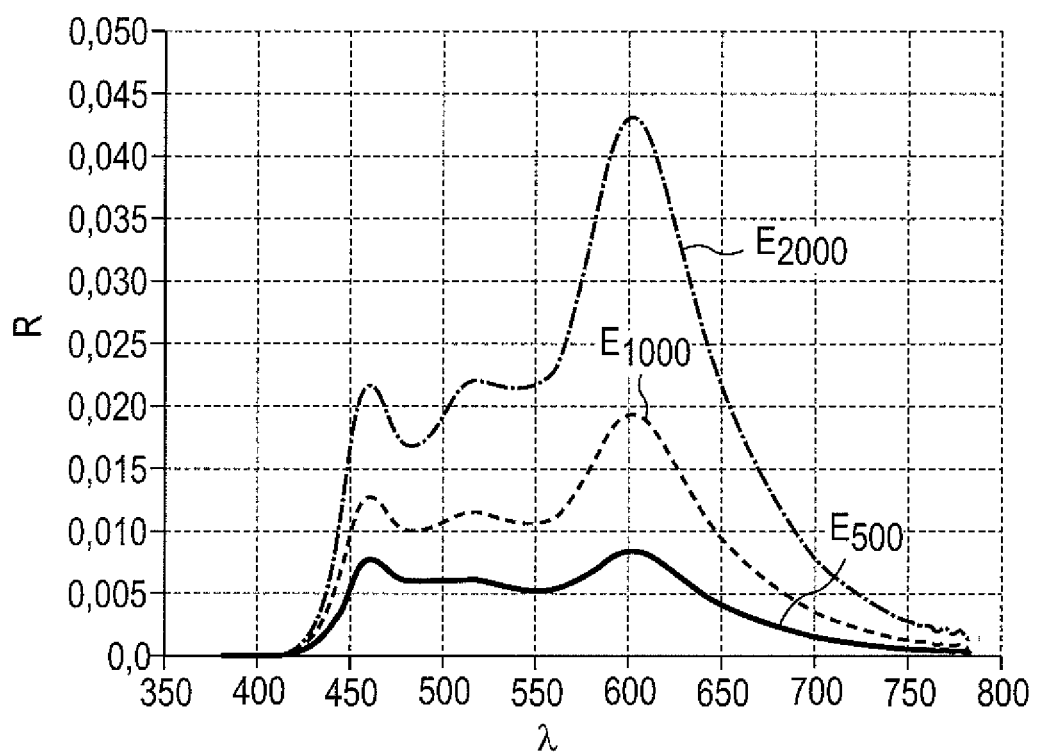

D

RADIATION EMITTING DEVICE AND METHOD FOR THE PRODUCTION THEREOF

RELATED APPLICATIONS

This is a U.S. national stage of application No. PCT/EP2008/062864, filed on Sep. 25, 2008, This application claims the priority or German application no. 10 2007 045 0753.9 filed Sep. 25, 2007 and 10 2007 058 005.5 filed Dec. 3, 2007, the entire content of both which is hereby incorporated by reference.

FIELD OF THE INVENTION

The invention relates to a radiation-emitting device with at least a first emission layer and a second emission layer.

SUMMARY OF THE INVENTION

One object of the invention is to provide an efficient, long-life radiation-emitting device, whose colour of emission is easily adjustable and exhibits only slight variations. Such a radiation-emitting device exhibits improved charge transport, which contributes to improving power efficiency and service life.

According to one embodiment of the invention, a radiation-emitting device comprises a first electrode, which emits charge carriers of a first charge when in operation, a first emission layer, which comprises a first emitter material and is arranged on the first electrode, a second emission layer, which comprises a second emitter material and is arranged on the first emission layer, and a second electrode, which emits charge carriers of a second charge when in operation and is arranged on the second emission layer. The first and/or second emitter material is here phosphorescent and the first emitter material emits radiation at a different wavelength as the second emitter material. Such a radiation-emitting device exhibits efficient emission of radiation combined with a good to very good service life. Furthermore, the colour of emission changes only slightly over the service life.

Furthermore, the radiation-emitting device may comprise a first charge-transporting layer, which is arranged between the first emission layer and the second emission layer. The first charge-transporting layer may transport charge carriers of the first charge and charge carriers of the second charge. By means of the first charge-transporting layer, charge carrier transport between the first emission layer and the second emission layer may be improved.

Furthermore, the first charge-transporting layer may comprise a matrix, which comprises a matrix material which transports charge carriers of the first and second charge, or a first matrix material, which transports charge carriers of the first charge, and a second matrix material, which transports charge carriers of the second charge. Thus, the property of the charge-transporting layer of transporting charge carriers of the first and second charge may be achieved. To this end, either a single matrix material, which may transport both charge carriers, is used or a mixture of two matrix materials, which may in each case transport different types of charge carrier, is used. The charge carrier balance in the device and transport of the charge carriers to the individual emission layers may be individually adapted to the individual emission layers by way of the mixing ratio of the matrix materials. Furthermore, the charge-transporting layer serves to separate the individual emission layers from one another and thus to suppress quenching and energy transfer processes. The distance between the emission layers and other layers may additionally be adjusted by the thickness of the first charge-transporting layer. As a result of the ambipolar nature of the first charge-transporting layer, it is possible, despite the possibly enlarged layer thickness or the total thickness of the device, to keep the operating voltage low and to minimize any accumulation of charge carriers at interfaces between the individual layers. This also reduces possible quenching of polarons with excitons.

The radiation-emitting device may furthermore comprise a third emission layer, which comprises a third emitter material and is arranged between the second emission layer and the second electrode. The third emitter material may here emit radiation at a different wavelength from the first and second emitter materials. By using three different emitter materials, which emit radiation at different wavelengths, a total emission may be produced which is composed of the three emitted radiations and for example comprises white light. In this way, such radiation-emitting devices are also suitable for illumination purposes.

Furthermore, the third emission layer may transport charge carriers of the second charge, the first emission layer may transport charge carriers of the first charge and the second emission layer may transport charge carriers of the second charge. It is also possible for the first and/or second and/or third emission layers to transport charge carriers of the first charge and charge carriers of the second charge. To this end, the first and/or second and/or third emission layers may comprise a matrix. The matrix may comprise a matrix material which transports charge carriers of the first and second charge, or it may comprise a first matrix material which transports charge carriers of the first charge and a second matrix material which transports charge carriers of the second charge. The emitter materials may accordingly be situated in different matrix materials, which are arranged one above the other. In this way, charge carrier transport in the emission layers through the layers may be optimised and charge carrier transport via the emitter materials may be avoided, so resulting in an increased service life. Purposeful use of a matrix of a first and second matrix material, of which in each case one matrix material preferably transports one charge carrier type, makes it possible to use the emitter materials in relatively low concentration and thus to minimise triplet-triplet annihilation. If just one matrix material were used or just one charge carrier type were preferably transported, the in each case other charge carrier type would have to be guided over the frontier orbitals of the emitter material, so making a high concentration of the emitter material necessary in the matrix. This would lead to decreased emission efficiency of the emitter material and quenching between adjacent emitter molecules. The concentration of matrix materials is adjusted in such a way that the charge carriers are efficiently passed on to the emitter materials in the other emission layers. The adjustable mixing ratio of the matrix materials allows sensitive adjustment of the ratio of the charge carrier types and thus good emission colour tunability over a wide range, without new materials having to be used. Even distribution of the two charge carrier types and of the emitter material over the entire emission layer leads furthermore to a broadened recombination zone, this being accompanied by greater efficiency and a broader emission spectrum. Thus, the radiation-emitting device is particularly suitable for illumination applications.

The device may furthermore comprise a second charge-transporting layer, which is arranged between the second and third emission layers. The second charge-transporting layer may transport charge carriers of the first charge and charge carriers of the second charge. In this case, the second charge-transporting layer comprises a matrix. The matrix may comprise a matrix material which transports charge carriers of the first and second charge, or a mixture of a first matrix material, which transports charge carriers of the first charge, and a second matrix material, which transports charge carriers of the second charge. The second charge-transporting layer exhibits the same properties as have been mentioned above for the first charge-transporting layer, and inter alia contributes to the third emission layer also being separated from the other emission layers and being at a suitable distance from the other layers.

Furthermore, the device may comprise a first electrode, which is reflective for the radiation emitted by the first and/or second emitter material. The first electrode may also be reflective for the radiation emitted by the first and/or second and/or third emitter material. As the distance between the emission layers and the reflective electrode increases, so the respective emitter materials may emit radiation of a greater wavelength. For example, a blue-emitting emission layer may be located closest to the reflective electrode, while a red-emitting emission layer is furthest away from the reflective electrode. Thus, the radiance of the individual colours is increased in a forwards direction, since negative interference may be avoided by the adjustable distance between the emission layers and the reflective electrode. The first, reflective electrode may be a cathode.

The second electrode may be transparent to the radiation emitted by the first and/or second emitter material. It may furthermore be transparent to the radiation emitted by the first and/or second and/or third emitter material. The transparent electrode may be an anode. The radiation emitted by the first, second and third emission layer may thus be coupled out of the radiation-emitting device though the transparent electrode.

Charge carrier supply may be assisted by further layers present between the first and second electrodes. A first doped transport layer may be present between the first electrode and the first emission layer, which transport layer transports the charge carriers of the first charge. In this respect, the first electrode may comprise a cathode and the first doped transport layer may be n-doped. In this case, the charge carriers of the first charge comprise electrons and the first doped transport layer comprises an electron transport layer. Thus, the electrons produced by the cathode may be particularly effectively transported to the emission layers. Between the first doped transport layer and the first emission layer a first blocking layer may additionally be present, which blocks charge carriers of the second charge and transports charge carriers of the first charge. Thus, if the first electrode comprises a cathode and the first doped transport layer comprises an electron transport layer, the electrons may be transported to the emission layers, while hole transport is prevented.

Furthermore, between the second electrode and the emission layer situated closest to the second electrode, there may be a second doped transport layer which transports charge carriers of the second charge. Between the second doped transport layer and the emission layer situated closest to the second electrode, there may also be a second blocking layer which blocks charge carriers of the first charge and transports charge carriers of the second charge. The second electrode may comprise an anode and the second doped transport layer may be p-doped. In this case, the charge carriers of the second charge may comprise holes and the second doped transport layer may comprise a hole transport layer. Thus, the holes supplied by the anode may be particularly readily conveyed to the emission layers, while electron transport is blocked. The series resistance of these first and second doped transport layers is virtually independent of the layer thickness thereof. Thus, the layer thickness, and therefore the distance between the emission layers and the electrodes may be adjusted and optimised without changing the electrical properties of the component.

The first and/or second and/or third emission layer may in each case exhibit an average distance from the reflective electrode which corresponds to a quarter of the wavelength of the emission of the respective emission layer. However, deviations from this average distance value are also possible. Thus, the radiation-emitting device comprises a cavitatively optimised layer sequence, since the radiance of the individual colours is increased in a forwards direction. As a result of the adjustable layer thicknesses of the charge-transporting layers, the emission layers exhibit an improved distance from the reflective electrode, such that negative interference can be avoided.

Furthermore, the surfaces of the first and/or second electrode facing the emission layers may exhibit unevennesses of a specific height. Such unevennesses may remain behind on these surfaces despite substrate cleaning. Such unevennesses may comprise particles with a thickness of less than 100 nm, which cannot be removed using conventional cleaning steps. The particles may also have a thickness of several μm and thus constitute massive unevennesses on the first or second electrode. Furthermore, the materials from which the first and/or second electrode are made have a tendency to develop spikes when deposited, which likewise form unevennesses. These spikes may be over 10 nm in height. Such unevennesses may result in the development of a local electrical short-circuit, which occurs either immediately or only after several hundred hours of operation. This would lead to total failure of the device.

The first and/or second electrode may comprise adjacent layers with a layer thickness which is greater than the height of the unevennesses. For example, such layer thicknesses may amount to more than 100 nm. In this way, the unevennesses may be enclosed in the surfaces of the respective electrode, so preventing severe electrical field overshoots from leading to electrical short-circuits. Enveloping of the unevennesses by increasing the thickness of the layers adjoining the electrodes may be performed from an electrical standpoint when these layers exhibit high levels of transparency together with high conductivity. Thus, the optical quality of the device is not influenced by the increase in layer thickness and no electrical losses are suffered. It is furthermore favourable for the unevennesses to exhibit good wettability, such that the enveloping provided by the layer material of the layers adjoining the electrodes covers the unevennesses well. The layer adjoining the first electrode may comprise the first doped transport layer, and the layer adjoining the second electrode may comprise the second doped transport layer. The first doped transport layer may for example comprise an electron transport layer and the second doped transport layer may comprise a hole transport layer.

The first and/or second doped transport layer may comprise doping gradients. To this end, the first and/or second doped transport layer may be subdivided into three sublayers, the first sublayer constituting the region closest to the first electrode, the third sublayer the region situated closest to the second electrode and the second sublayer constituting the region between the first and the third sublayers. Mutually independently, the concentration of the dopant in the first and/or second doped transport layer may be on average higher in the first sublayer than in the second sublayer and higher in the second sublayer than in the third sublayer. Furthermore, the concentration of the dopant may be higher on average in the third transport layer than in the second sublayer and higher in the second sublayer than in the third sublayer. It is furthermore possible for the doping concentration in the second sublayer to be on average lower or higher than in the first and third sublayers. The concentration in the first and third sublayers may then in each case rise or fall in the direction of the second sublayer. The doping gradients of the transport layers may prevent charge carrier accumulation effects and prevent band bending. Furthermore, the gradients may prevent changes in emission zones and the service life of the device may be increased.

The first emitter material may be fluorescent and the second emitter material phosphorescent. Furthermore, the first material may be fluorescent and the second and third emitter materials phosphorescent. Thus, highly efficient phosphorescent emitter materials are combined together with less efficient fluorescent emitter materials, which, together with the matrix materials used in the conductivity-doped transport layer and blocking layers, allow efficient emission at the same time as a long service life.

The radiation-emitting device may comprise an organic light-emitting diode (OLED). The OLED may comprise a first and second emission layer or a first, second and third emission layer, which comprise organic materials. Light may be emitted by the OLED which is generated by mixing the emission of radiation by the first emission layer and the second emission layer or by mixing the emission of radiation by the first emission layer, the second emission layer and the third emission layer. This mixture may comprise white light, wherein for example in each case one of the emission layers emits red radiation, blue radiation or green radiation.

Thus, by using charge-transporting layers, which transport charge carriers of the first and second charges, with optimised combinations of emitter materials and matrix materials and adapted blocking layers and doped transport layers in a cavitatively optimised structure, loss channels are purposefully turned off and the emissions of the individual emitter materials are improved. This results in good efficiency accompanied by a long service life and low colour location variation over a broad brightness range. The combination of ambipolar matrix materials, which are present in the emission layers and charge-transporting layers, with cavitatively optimised layer thicknesses, adapted charge carrier blocking layers and conductivity-doped charge carrier transport layers serves in the simultaneous optimisation of service life and efficiency with adjustable emission colour. In this case, the ambipolar matrix materials lead to the suppression of polaron quenching with excitons at the boundary surfaces, and to the prevention of energy transfer between different emitter materials. Thus the device is particularly suitable for white LEDs, which may be used for illumination applications.

A method is additionally provided for producing a radiation-emitting device having the above-stated properties. The method comprises the following method steps:

A) providing a first emitter material and a second emitter material for producing a first emission layer and a second emission layer, and
B) producing the first emission layer on a first electrode, the second emission layer on the first emission layer, and a second electrode on the second emission layer.

Furthermore, in method step A) a third emitter material may additionally be provided for producing a third emission layer and in method step B) the third emission layer may be arranged between the second emission layer and the second electrode.

In a method step A1) before method step A) the first emitter material may be mixed with a matrix which transports charge carriers of a first charge and/or charge carriers of a second charge, and the second emitter material may be mixed with a matrix which transports charge carriers of a first charge and/or a second charge. In method step A1) the third emitter material may furthermore be mixed with a matrix which transports charge carriers of a first charge and/or a second charge. In this respect, the charge carriers of the first charge may for example comprise electrons and the charge carriers of the second charge may for example comprise holes.

The matrix may comprise a matrix material which transports charge carriers of the first and second charge. It may additionally comprise a first matrix material which transports charge carriers of the first charge and a second matrix material which transports charge carriers of the second charge.

In a method step B1) following method step A), a first charge-transporting material, which transports charge carriers of a first charge and charge carriers of a second charge, may moreover be provided for producing a first charge-transporting layer. In method step B1), a second charge-transporting material, which transports charge carriers of a first charge and charge carriers of a second charge, may moreover additionally be provided for producing a second charge-transporting layer. The first and second charge-transporting materials may comprise a matrix which comprises a matrix material which transports charge carriers of the first and second charges, or a first matrix material, which transports charge carriers of the first charge, and a second matrix material, which transports charge carriers of the second charge.

In method step B) the first charge-transporting layer may be arranged between the first emission layer and the second emission layer and/or the second charge-transporting layer may be arranged between the second and the third emission layer.

In method step A) further layers may be provided, which are selected from a group comprising a first blocking layer, a second blocking layer, a first doped transport layer and a second doped transport layer. Furthermore, in method step B) the first doped transport layer may be arranged on the first electrode and the first blocking layer may be arranged on the first doped transport layer and/or the second blocking layer may be arranged between the emission layer closest to the second electrode and the second electrode, and the second doped transport layer may be arranged between the second blocking layer and the second electrode.

BRIEF DESCRIPTION OF THE DRAWINGS

FIG. 1 shows the schematic side view of an embodiment of a layer sequence of the radiation-emitting device.

FIG. 7 shows the emission spectrum of a radiation-emitting device at various luminance values.

DETAILED DESCRIPTION OF THE DRAWINGS

Figure 2A:
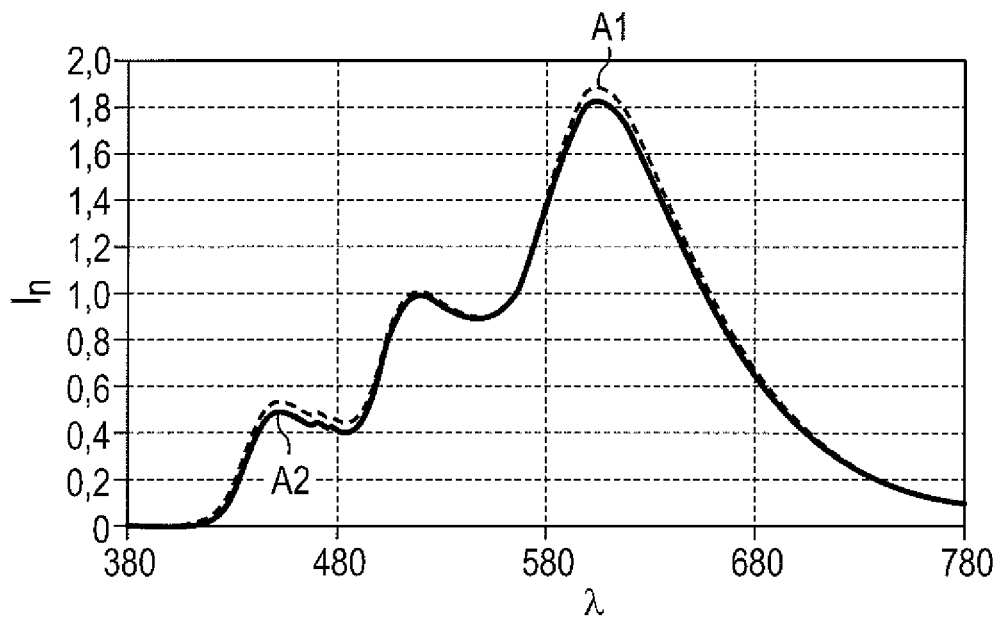
FIG. 2 shows a) an emission spectrum of a radiation-emitting device before and after ageing and b) the position of the colour of emission in the 1931 CIE diagram.

An exemplary layer sequence for a radiation-emitting device will be illustrated with reference to FIG. 1. The device comprises a first electrode 100, a first doped transport layer 200, a first blocking layer 300, a first emission layer 400, a first charge-transporting layer 500, a second emission layer 410, a second charge-transporting layer 510, a third emission layer 420, a second blocking layer 310, a second doped transport layer 210 and a second electrode 110. The layer thicknesses d of the first blocking layer 300, the second blocking layer 310 and the first charge-transporting layer 500 amount in each case to 5 to 15 nm, preferably 5 to 10 nm, wherein the first blocking layer 300 may also have a thickness of 10 to 400 nm. The layer thicknesses of the second charge-transporting layer 510 amount to up to 15 nm, preferably up to 5 nm, the first and second emission layer 400, 410 to in each case 5 to 15 nm, the third emission layer 420 to in each case 5 to 10 nm. The first and second doped transport layers 200, 210 comprise layer thicknesses of 5 to 400 nm, preferably of 100 to 400 nm. The first electrode 100 has a thickness of 40 to 200 nm, preferably of 100 to 200 nm, the second electrode 110 has a thickness of approx. 120 nm.

The radiation-emitting device taken as basis below is one in which the first electrode 100 is a reflective cathode, for example an Ag layer, and the second electrode 110 is a transparent anode, for example an ITO layer (indium-tin oxide). The first emission layer 400 constitutes a fluorescent blue emission layer, the second emission layer 410 a phosphorescent green emission layer and the third emission layer 420 a phosphorescent red emission layer. The electrodes and emission layers are, of course, also in each case interchangeable. It is additionally assumed that the blue emission layer comprises a fluorescent emitter material in an electron-conducting matrix, the phosphorescent green emission layer comprises emitter materials in a hole- and electron-conducting matrix and the phosphorescent red emission layer comprises emitter material in a hole-transporting matrix. These matrix compositions in the individual emission layers may also be varied as desired. The two charge-transporting layers 500, 510 in each case comprise a matrix which is hole- and electron-conducting, this likewise being variable.

Examples of materials are stated below which may be used for the respective layers. The list is not exhaustive, however, the use of further materials not mentioned here being conceivable. The materials of the other layers may be selected and varied in accordance with desired efficiency, colour of emission and service life.

In the exemplary embodiment the second electrode 110 is a transparent anode, for example an ITO anode (indium-tin oxide anode). The first electrode 100 comprises a reflective cathode, for example of silver or aluminium.

The second doped transport layer 210 may be p-doped and comprise a hole transport layer. Examples of materials which may be used as hole transport materials are 1-TNATA (4,4',4"-tris-(N-(naphth-1-yl)-N-phenylamino)triphenylamine), which is shown in formula 1:

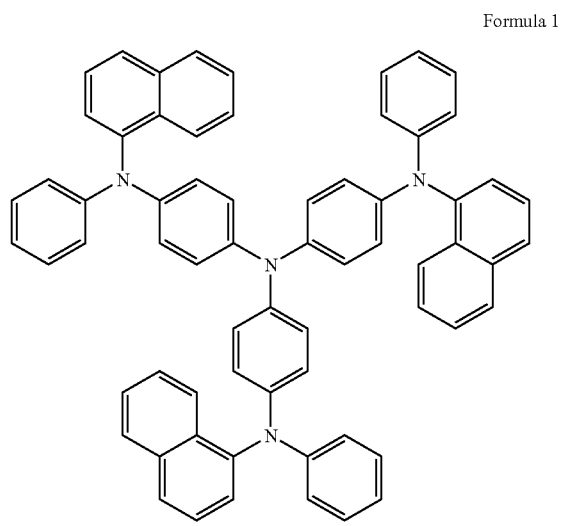 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1]

Formula 1

A further example is MTDATA (4,4',4"-tris-(N-3-methylphenyl-N-phenylamino)triphenylamine), as illustrated in formula 2:

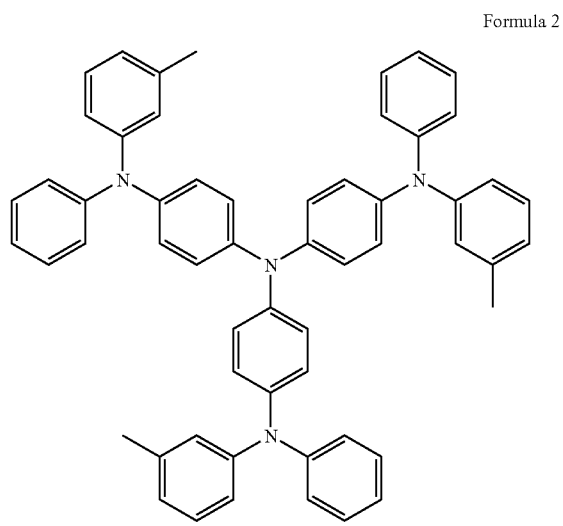 [SMILES: Cc1cccc(N(c2ccccc2)c2ccc(N(c3ccc(N(c4ccccc4)c4cccc(C)c4)cc3)c3ccc(N(c4ccccc4)c4cccc(C)c4)cc3)cc2)c1]

Formula 2

Further examples are 2-TNATA (4,4',4"-tris-(N-(naphth-2-yl)-N-phenylamino)triphenylamine), α-NPB (N,N'-bis-(naphthalen-1-yl)-N,N'-bis-(phenyl)benzidine), β-NPB (N,N'-bis-(naphthalen-2-yl)-N,N'-bis-(phenyl)-benzidine), TPD (N,N'-bis-(3-methylphenyl)-N,N'-bis-(phenyl)-benzidine), spTAD (2,2',7,7'-diphenylaminospiro-9,9'-bifluorene), Cu—PC (phthalocyanine copper complexes), further phthalocyanine metal complexes, pentacene and TAPC (1,1-bis-[(4-phenyl-)-bis-(4',4"-methylphenyl)-amino]-cyclohexane).

These materials comprise a HOMO (Highest Occupied Molecular Orbital) of −5.2±0.4 eV and a LUMO (Lowest Unoccupied Molecular Orbital) of −2.2±0.4 eV. Hole mobility amounts to around $10^{-4}$ cm$^2$/Vs and the conductivity of a doped layer at 2 to 10 vol. % of the dopant amounts to approx. $10^{-5}$ S/cm.

An example of a dopant in a hole transport layer is F$_4$-TCNQ (2,3,5,6-tetrafluoro-7,7,8,8-tetracyanoquinodimethane), which is shown in formula 3:

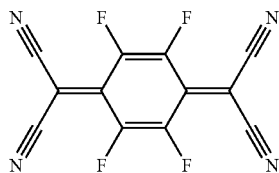

Formula 3

Further dopants are for example molybdenum oxide and rhenium oxide.

The second blocking layer 310, which serves as an electron blocking layer, may comprise α-NPD (N,N'-di-1-naphthyl-N,N'-diphenyl-4,4'-diaminobiphenyl), as shown in formula 4:

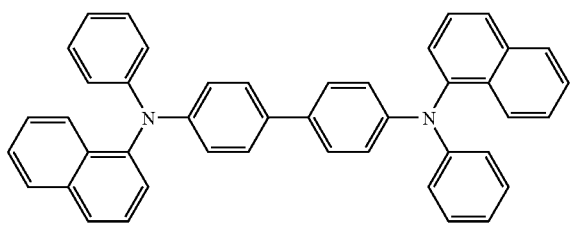

Formula 4

This material has a HOMO of −5±0.4 eV and a LUMO of more than −2.2 eV. Hole mobility amounts to around $10^{-4}$ cm$^2$/Vs.

If the third emission layer 420 is a red, phosphorescent emission layer, Ir(DBQ)$_2$acac (iridium(III) bis-(2-methyldibenzo-[f,h]quinoxaline) (acetylacetonate)), as shown in formula 5, serves as the phosphorescent, red emitter material:

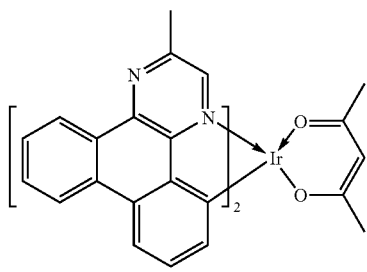

Formula 5

This emitter material has a main emission wavelength of over 600 nm, and in the 1931 CIE diagram an x value of >0.6 and a y value of <0.36.

A red emission layer may comprise a matrix which transports holes. A suitable matrix material is α-NPD (N,N'-di-1-naphthyl-N,N'-diphenyl-4,4'-diaminobiphenyl), as shown in formula 4. The material has a HOMO of −5.5±0.4 eV and a LUMO of −2.1±0.4 eV. Hole mobility amounts to around $10^{-4}$ cm$^2$/Vs and the triplet position T1 is over 1.8 eV.

Between the third 420 and the second emission layer 410 there may be a second charge-transporting layer 510 which comprises a first and second matrix material.

The first matrix material of the second charge-transporting layer 510 may comprise a hole-transporting matrix material, which may for example be 1-TNATA or α-NPD. These materials have a HOMO of −5.5±0.6 eV and a LUMO of −2.1±0.4 eV. Hole mobility amounts to around $10^{-4}$ cm$^2$/Vs and the triplet position T1 is >1.8 eV.

An electron-conducting, second matrix material in the second charge-transporting layer 510 may for example be BCP (2,9-dimethyl-4,7-diphenyl-1,10-phenanthroline), which is shown in formula 6:

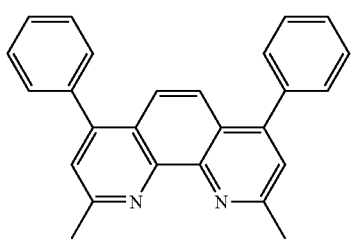

Formula 6

A further example is Bphen (4,7-diphenyl-1,10-phenanthroline), which is shown in formula 7:

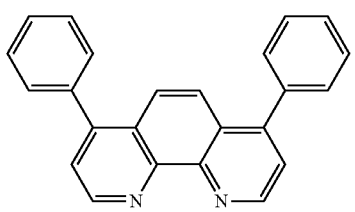

Formula 7

These materials have the property that the HOMO amounts to −6.4 to −5.7 eV and the LUMO amounts to −2.3 to −1.8 eV, T1 is >2.5 eV, and electron mobility is around $10^{-6}$ cm$^2$/Vs.

The second emission layer 410 is a green phosphorescent emission layer, which comprises a green emitter material in a first and second matrix material. Irppy (fac-tris-(2-phenylpyridyl)-iridium), which is shown in formula 8, may for example be used as the green emitter material:

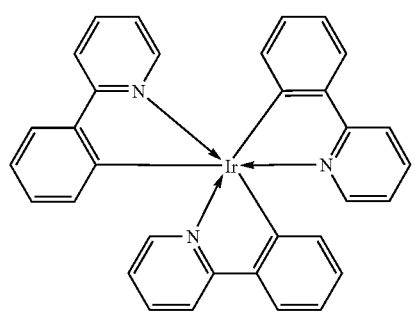

Formula 8

The material has a main emission wavelength of 500 to 570 nm and in the 1931 CIE diagram an x value of around 0.37 and a y value of around 0.6.

A hole-transporting, first matrix material in the second emission layer 410 may for example be TCTA (4,4',4''-tris-(carbazol-9-yl)triphenylamine), which is shown in formula 9:

Formula 9

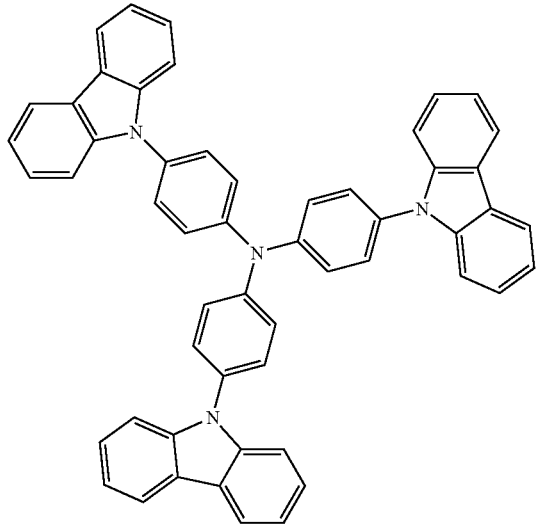

Or it may be CBP (4,4'-bis-(carbazol-9-yl)biphenyl, which is shown in formula 10:

Formula 10

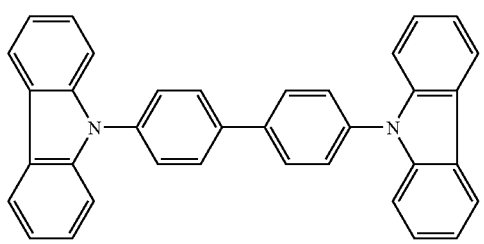

These materials have a HOMO of −6.0 to −5.3 eV and a LUMO of −2.3±0.1 eV, a T1 of over 2.5 eV and a hole mobility of around $10^{-4}$ cm$^2$/Vs.

An electron-conducting, second matrix material in the second emission layer 410 is for example BCP or Bphen with the above-stated properties, wherein electron mobility should be greater than $10^{-5}$ cm$^2$/Vs, preferably $10^{-4}$ cm$^2$/Vs.

The first charge-transporting layer 500, which is composed of a first and a second matrix material, is located between the green, second emission layer 410 and the first emission layer 400, which may be a fluorescent, blue emission layer. The first matrix material may be a hole-transporting matrix material, which may be TCTA or CBP with the above-stated properties. The electron-conducting matrix material may be BCP or Bphen with the above-stated properties.

The blue, third emission layer 400 may be a fluorescent emission layer, with the blue fluorescent emitter material DPVBi (4,4'-bis-(2,2-diphenylethen-1-yl)-diphenyl), as shown in formula 11:

Formula 11

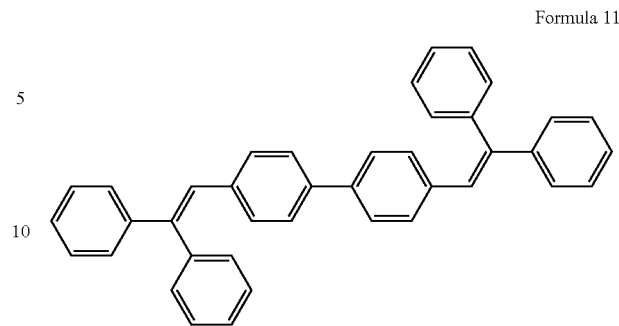

This material has a main emission wavelength of 450 to 770 nm, a half-value width of approx. 60 nm and in the 1931 CIE diagram x values of 0.14 to 0.22 and y values of 0.11 to 0.20.

The blue emitter material may be present in an electron-conducting matrix, which may comprise as its material TBADN (2-tert.-butyl-9,10-di(2-naphthyl)anthracene, as shown in formula 12:

Formula 12

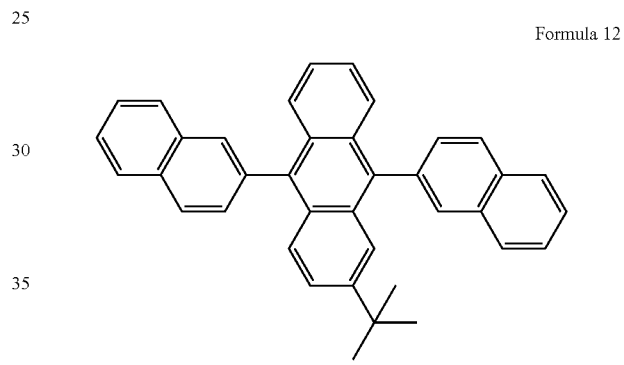

This material has a HOMO of −5.8 to −5.3 eV and a LUMO of −2.5 to −1.8 eV. The band gap amounts to more than 3 eV and electron mobility is greater than $10^{-6}$ cm$^2$/Vs, preferably greater than $10^{-5}$ cm$^2$/Vs.

The first blocking layer 300 comprises a hole-blocking layer, which comprises as its material BCP or Bphen with the above-stated properties. An important factor here is the electron mobility of more than $10^{-6}$ cm$^2$/Vs, preferably more than $10^{-5}$ cm$^2$/Vs, alongside very slight to absolutely no hole mobility.

The first doped transport layer 200 may be an n-doped electron transport layer, which comprises as its electron-conducting matrix material Bphen (formula 7),
Alq$_3$ (tris-(8-hydroxiquinoline)aluminium),
BAlq$_2$ (bis-[2-methyl-8-quinolinato]-[4-phenylphenolato]-aluminium(III)),
BCP (formula 6),
TPBl (1,3,5-tris-(1-phenyl-1H-benzimidazol-2-yl)-benzene),
TAZ (3-(4-biphenyl)-4-phenyl-5-(4-tert-butylphenyl)-1,2,4-triazole),
TAZ2 (3,5-diphenyl-4-naphth-1-yl-1,2,4-triazole),
t-Bu-PBD (2-(4-biphenylyl)-5-(4-tert-butylphenyl)-1,3,4-oxadiazole),
triazine or triazine derivatives. The matrix material has a HOMO of −6.4 to −6.0 eV, a LUMO of −2.3 to −1.8 eV, an electron mobility of more than $10^{-6}$ cm$^2$/Vs, preferably more than $10^{-5}$ cm$^2$/Vs and a conductivity in a doped layer (at 6 to 50 vol. % of dopant) of $10^{-5}$ S/cm. Lithium, caesium or calcium may be used as dopant.

Other matrix materials, dopants or emitter materials are of course also possible for all the layers, as well as other compositions of the mixed matrix materials. Further materials for emitter materials, transport materials and dopants are possible and may be exchanged at any time.

Figure 2B:
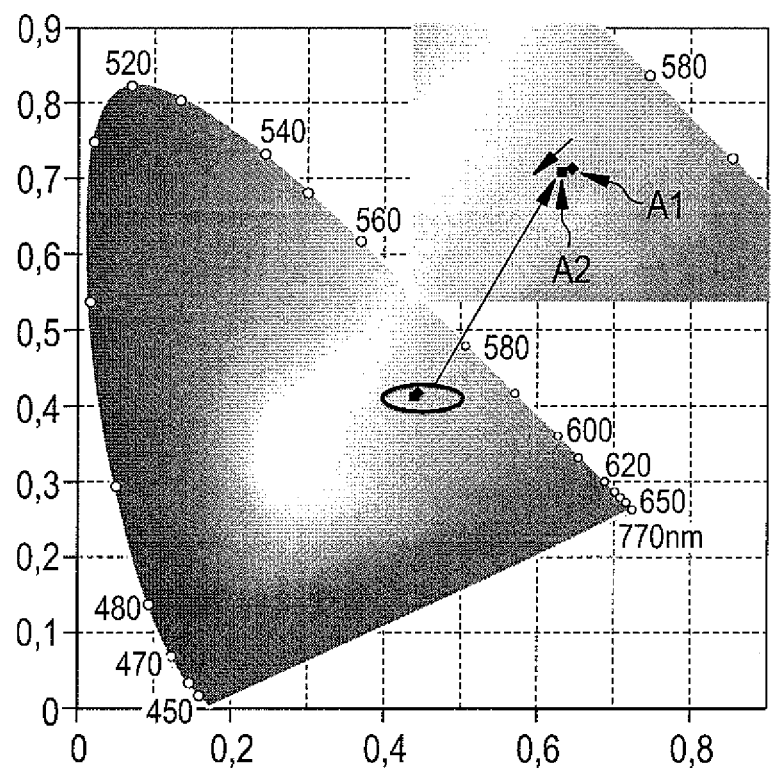

FIG. 2a shows an emission spectrum of a radiation-emitting device before and after ageing. The device in this example comprises three directly successive emission layers 400, 410 and 420, whose emitter materials are in each case present in a conductive matrix. The second, green emission layer 410 and the third, red emission layer 420 in each case comprise a mixture of the first and second matrix materials, i.e. a hole- and electron-transporting matrix. The blue, first emission layer 400 comprises a predominantly electron-conducting matrix. Ageing is defined in this case in such a way that the device was operated at 1000 cd/m$^2$ until half luminance was reached. The emission spectra A1 (before ageing) and A2 (after ageing) were measured before and after operation of the device. In the emission spectrum in which normalised intensity $I_n$ is plotted in arbitrary units against wavelength $\lambda$ in nm, it is clear that the device has a colour of emission which changes only slightly over its service life, since the two emission spectra are almost congruent. The same effect is visible in FIG. 2b, in the 1931 CIE diagram, in which the colours of emission before ageing A1 and after ageing A2 have barely changed in colour location and thus have very similar x and y values. It may thus be demonstrated that the hole- and electron-conducting matrix present in the emission layers in the green and red emission layers and the electron-conducting matrix in the blue emission layer also has scarcely any negative influence on the colour of emission of the device after an ageing process. A device constructed in this way is thus colour-stable over its service life.

It has been possible to demonstrate that devices which comprise charge-transporting layers between the first and second emission layer are also colour-stable. Such devices comprise charge-transporting layers which are free of triarylamines.

Figure 3:
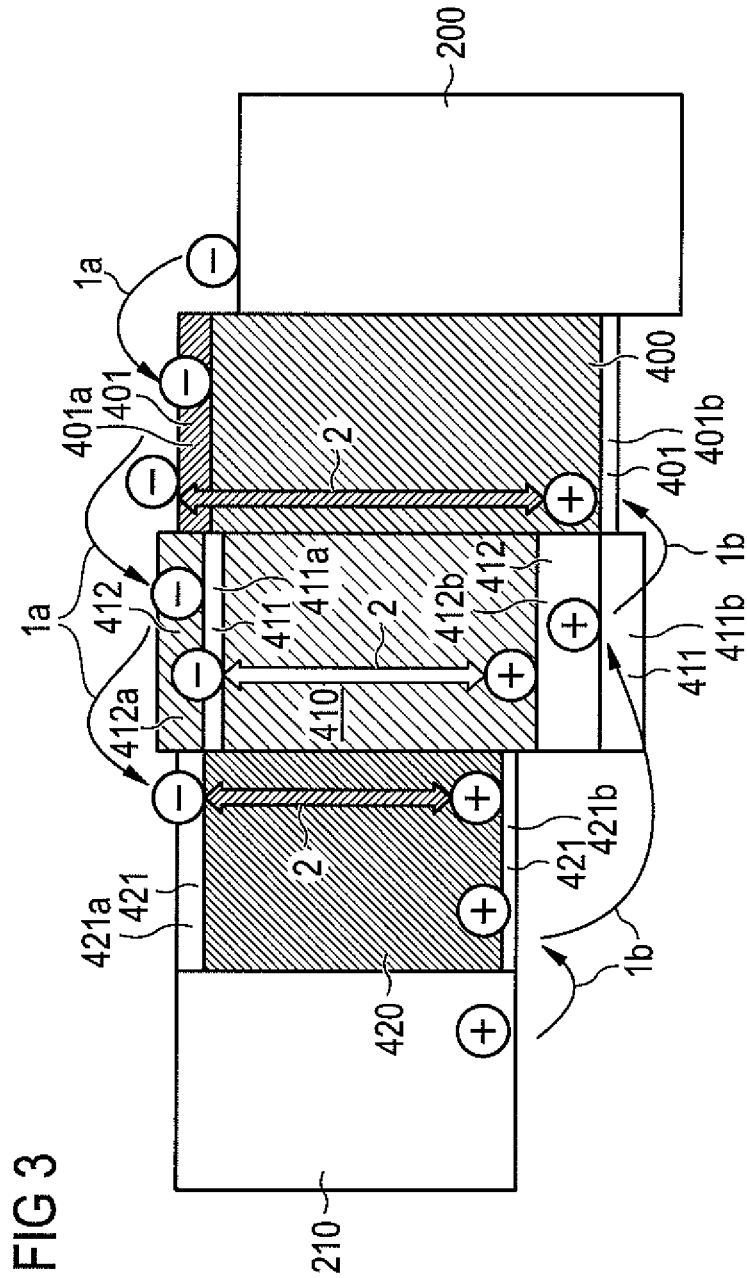
FIG. 3 shows an energy diagram cross-section through a radiation-emitting device.

FIG. 3 shows an energy diagram cross-section through a radiation-emitting device, which comprises a third emission layer 420, which emits red and comprises a hole-conducting matrix material 421, a first emission layer 400, which emits blue and comprises an electron-conducting matrix material 401, and a second emission layer 410, which emits green and comprises both a hole-conducting matrix material 412 and an electron-conducting matrix material 411, the three emission layers succeeding one another directly. The three emission layers, whose respective HOMO-LUMO energy gap 2 is likewise indicated schematically in FIG. 3 as double-headed arrows, are located between two doped transport layers 200, 210, the second doped transport layer 210 being a hole transport layer and the first doped transport layer 200 being an electron transport layer. The red, third emission layer 420 comprises a red emitter material and a hole-conducting matrix material 421, which comprises a HOMO 421a and a LUMO 421b. Likewise, the first emission layer 400, the blue emission layer, comprises a matrix material, which conducts electrons and comprises a HOMO 401a and a LUMO 401b. The green, second emission layer 410 comprises a hole-conducting matrix material 412, with a HOMO 412a and a LUMO 412b and an electron-conducting matrix material with a HOMO 411a and a LUMO 411b. This sequence of emission colours results in good radiance in the forwards direction.

The phosphorescent red emitter material is preferably embedded in a hole-conducting matrix material 421, such that the holes may travel easily from the anode to the middle, green, second emission layer 410 and thus likewise be available to the other emission layers (hole transport 1b).

The green, second emission layer 410 has a green emitter material, which is embedded both in an electron-conducting 411 and a hole-conducting matrix material 412. In this way, only a small concentration of green emitter material is necessary, such that quenching, such as for example in the form of triplet annihilation, is reduced. Hole transport 1b through the green, second emission layer 410 to the blue, first emission layer 400 is guaranteed. When two matrix materials are used, care must be taken to ensure that the position of the HOMO and LUMO values of the two matrix materials are conformed to one another. For instance, the LUMO of the electron-conducting matrix material should be lower than the LUMO of the hole-conducting matrix material and the HOMO of the electron-conducting matrix material should be lower than the HOMO of the hole-conducting matrix material. Attention should also be paid to the triplet layers T1 of the matrix materials used, which have to be energetically higher for both matrix materials than the triplet position T1 of the emitter material used. Otherwise, an electron transfer to the T1 level of the matrix material may proceed with subsequent non-radiative decay of the exciton.

Hole transport 1b may thus take place in the device via the HOMO of the additional hole-conducting matrix material 412 of the green, second emission layer 410, such that it is possible to reduce the concentration of the green emitter material to concentrations of 1 to 10%. At low concentration the green emitter material then acts merely as a hole trap, thus developing its maximum quantum efficiency and contributing only very slightly to hole transport. The layer thickness of the green, second emission layer 410 may be reduced due to the increased efficiency. Operating voltage is reduced as a result. Improved charge carrier transport leads, moreover, to a reduced potential drop over the green, second emission layer 410. Hole transport 1b and electron transport 1a may be regulated in the layer sequence by means of the mixing ratio of preferably hole- and electron-conducting matrix materials 411, 412, the colour of emission thereby being adjusted.

If the proportion of the preferably hole-conducting matrix material 412 is increased, the overall emission spectrum of the device shifts in favour of blue. Conversely, the spectrum shifts in favour of red and green if the proportion of the preferably electron-conducting matrix material 411 is increased. For example, a ratio of 30% hole-conducting matrix material 412, 60% electron-conducting matrix material 411 and 10% green emitter material is suitable for warm white (0.4/0.4 in the 1931 CIE diagram). A ratio with an increased concentration of the hole-conducting matrix material 412, such as for example 45% hole-conducting matrix material 412, 45% electron-conducting matrix material 411 and 10% green emitter, is suitable for increasing the blue proportion of the spectrum and thus establishing a cooler white (CIE: 0.33/0.33).

By using a hole-transporting matrix material 421 in the red, third emission layer 420, the injected electrons accumulate at the boundary surface with the green, second emission layer 410. The predominant number of excitons form at this boundary surface. Because the thickness of the red, third emission layer 420 does not have any influence on the intensity of red emission, it may be demonstrated that recombination of the excitons proceeds almost exclusively at the boundary surface with the green, second emission layer 410. The high concentration of excited states (excitons) at this boundary surface results in extinction processes, such as triplet-triplet annihilation and exciton-polaron quenching.

Figure 4:
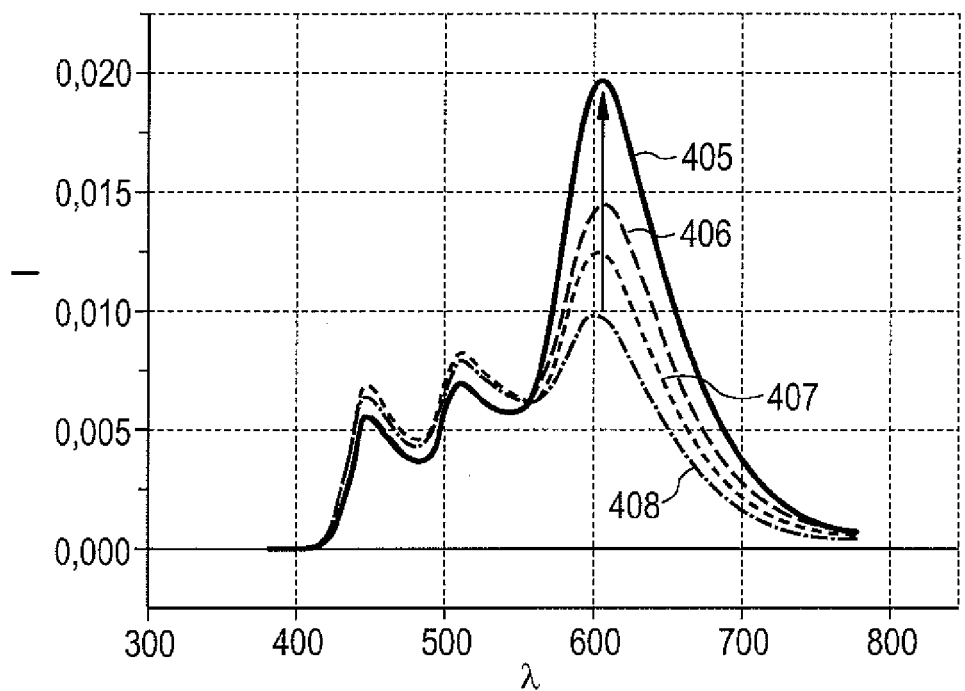
FIG. 4 shows emission spectra of radiation-emitting devices with a first and a second matrix material in one emission layer.

To avoid these loss mechanisms and thus improve the characteristics of the layer sequence, a mixture of two matrix materials was introduced into the red, third emission layer 420. By introducing an electron-conducting matrix into the red emission layer, the recombination zone may be broadened. In this case, the other colours are not influenced negatively, but red emission is instead merely intensified. The overall efficiency of the device is thus increased. This can be seen for example in FIG. 4. This shows emission spectra for radiation-emitting devices with a mixed matrix comprising two matrix materials in the red, third emission layer 420. Intensity I is plotted against wavelength λ in nm. Emission from four devices was measured, the red emission layers in each case comprising different mixing ratios of the matrix materials. The spectrum 405 shows the emission of a device with a mixing ratio of the matrix materials in the red emission layer of 45% hole-conducting matrix material and 45% electron-conducting matrix material. The spectrum 406 shows the emission with a mixing ratio of 55% hole-conducting matrix material and 35% electron-conducting matrix material in the red emission layer. The spectra 407 and 408 show the emissions from devices with mixing ratios in the red emission layer of 65% hole-conducting matrix material to 25% electron-conducting matrix material (spectrum 407) or 75% hole-conducting matrix material and 15% electron-conducting matrix material (spectrum 408). It is clear that, with an elevated proportion of electron-conducting matrix material, emission in the red range (approx. 600 nm) is increased, while emissions in the green (approx. 520 nm) and blue (approx. 450 nm) ranges remain almost constant. It may thus be demonstrated that the red emission intensity may be varied by varying the mixing ratio of the matrix materials, without the other colours being negatively influenced.

If a radiation-emitting device is present, in which there is no charge-transporting layer between the blue, first emission layer 400 and green, second emission layer 410, the green phosphorescent emission layer directly adjoins the fluorescent blue emission layer. Should the triplet energy of the fluorescent blue emitter material or of the matrix material for the blue emitter be below the triplet energy of the green phosphorescent emitter material, exciton transfer will take place by means of Forster transfer from green to blue. Since in the case of fluorescent blue emitter material or of the matrix material, only the singlet excitons decay radiatively to this end, the triplet excitons, which have been transferred from green to blue, are thus lost, since they do not recombine radiatively. In order in such a case to suppress this transfer, an interlayer, which is a first charge-transporting layer 500, with a specific thickness may be inserted between the green phosphorescent emission layer and the fluorescent blue emission layer. The triplet energy of this charge-transporting layer should in this case always be higher than the triplet energy of the green phosphorescent emitter. By introducing a charge-transporting layer with just one type of matrix material, this transfer is prevented, but the charge carrier equilibrium of the layer sequence is changed completely. If, for example, an electron-conducting charge-transporting layer is inserted, predominantly red and green emission is obtained, since more holes are accumulated in the green, second emission layer 410 and thus fewer holes reach the blue, first emission layer 400.

Figure 5:
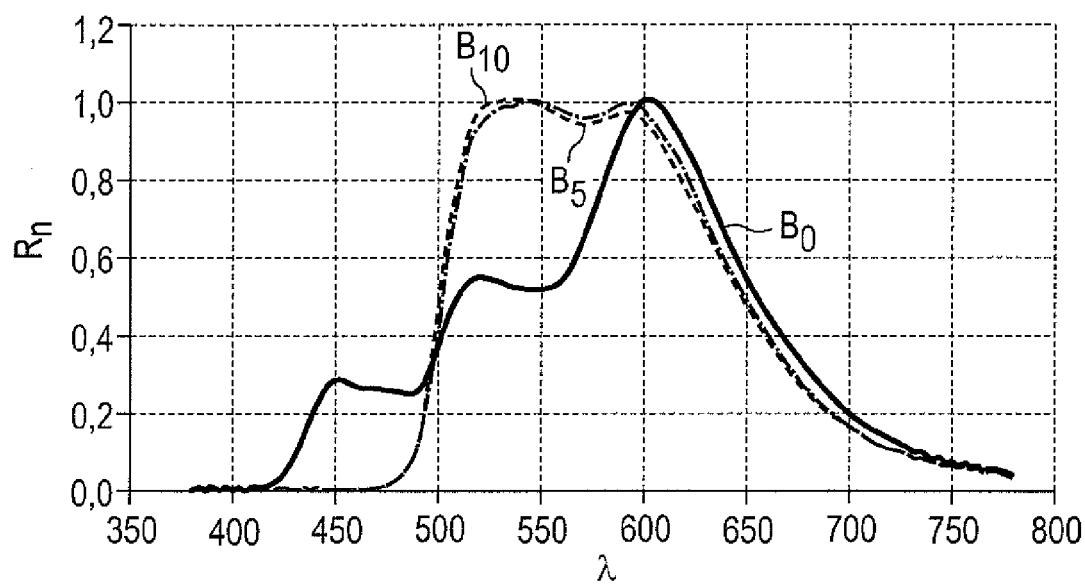
FIG. 5 shows emission spectra of a radiation-emitting device without charge carrier transport layer and with charge carrier transport layer.

This is shown for example in FIG. 5, which shows emission spectra for a device without charge-transporting layer $B_0$ and emission spectra for devices with a charge-transporting layer between the blue and green emission layer of 5 nm thickness $B_5$ and 10 nm thickness $B_{10}$. Normalised radiance $R_n$ in W/(srm²nm) is plotted against wavelength λ in nm. The device without charge-transporting layer exhibits white emission with peak maxima at blue emission (approx. 450 nm), green emission (approx. 520 nm) and red emission (approx. 600 nm). The spectra $B_5$ and $B_{10}$ exhibit emission in which only red and green radiation are still present, the blue emission having disappeared. This is irrespective of how thick said charge-transporting layer between the blue and green emission layers is, since the spectra $B_5$ and $B_{10}$ have a very similar distribution. In general, however, a charge-transporting layer between the blue and green emission layers should have a thickness of at least 5 nm. If a purely hole-conducting charge-transporting layer were inserted between the blue and green emission layers, predominantly blue emission would be obtained, since more electrons accumulate in the blue emission layer and thus fewer electrons reach the red and green emission layer (not shown here).

To improve emission in the layer sequence and to impair neither hole nor electron transport, a first charge-transporting layer 500 may be inserted between the green, phosphorescent, second emission layer and the blue, fluorescent, first emission layer, comprising a mixture of matrix materials. This charge-transporting layer consists of a hole-conducting matrix material and an electron-conducting matrix material. In this case, the LUMO of the electron-conducting matrix material should be lower than the LUMO of the hole-conducting matrix material and the HOMO of the electron-conducting matrix material should be lower than the HOMO of the hole-conducting matrix material. This charge-transporting layer can then transport both charge carrier types, but the transfer of green triplet excitons to the blue emission layer is prevented. The overall efficiency of the device is thus increased. The optimum thickness of this charge-transporting layer is the decisive factor here. If the thickness is too small, transfer is insufficiently suppressed and if the thickness is too great, the voltage drops too much thereover. Through the mixing ratio of hole- and electron-conducting matrix material, hole and electron transport in the device may be regulated and the overall emission colour adjusted. A suitable material combination comprises T1 levels which lie above the T1 level of the green emitter material, such that outflow of triplet excitons to the first charge-transporting layer 500 is suppressed. If the proportion of hole-conducting matrix is increased, the spectrum shifts in favour of blue. Conversely, the spectrum shifts in favour of red and green if the proportion of the electron-conducting matrix material is increased.

Figure 6A:
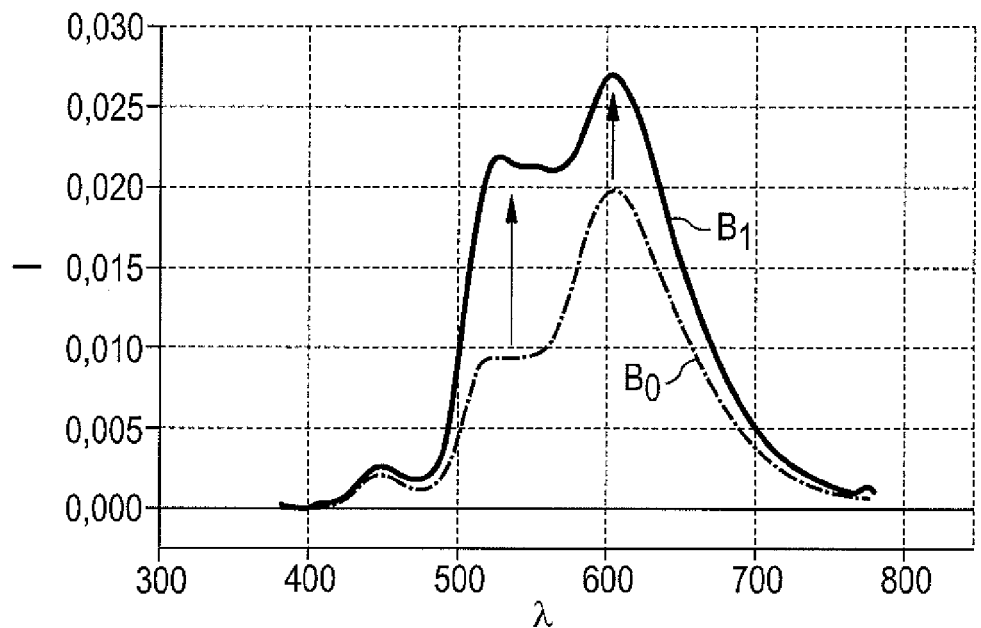
FIG. 6 shows emission spectra of radiation-emitting devices without charge carrier transport layer and with charge carrier transport layer (FIG. 6a), the ratios of the matrix materials in the charge-transporting layer varying (FIG. 6b).
Figure 6B:
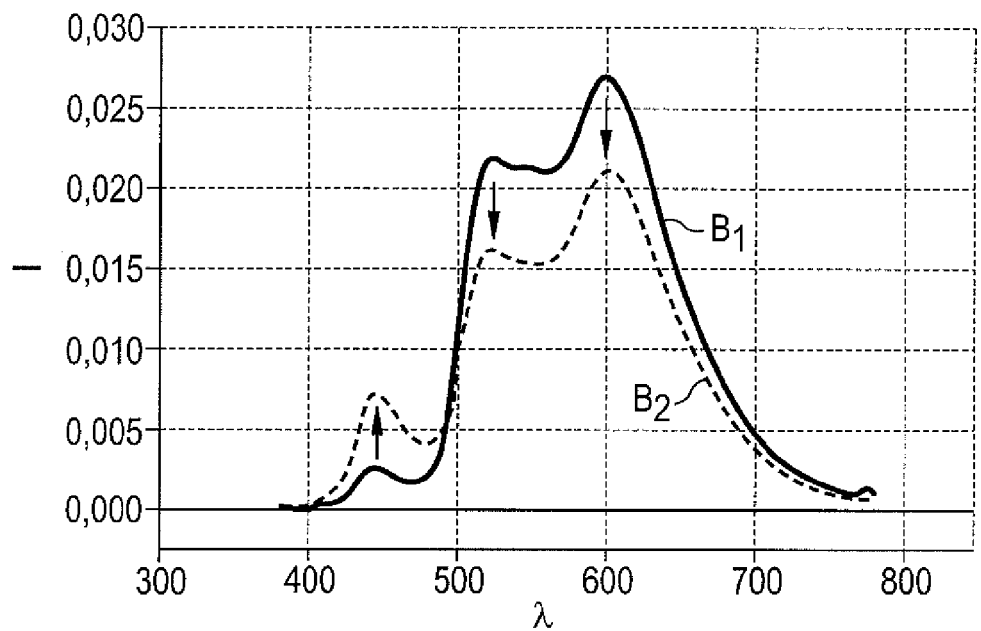

FIGS. 6a and 6b show two emissions spectra (intensity I against wavelength λ in nm). The spectra were measured by devices which comprise charge-transporting layers between the fluorescent blue emission layer and the phosphorescent green emission layer, the charge-transporting layers containing different mixing ratios of the matrix materials. Spectrum $B_0$ in FIG. 6a shows a device without charge-transporting layer 500 between the blue, first emission layer 400 and the green, second emission layer 410, while spectrum $B_1$ shows a device with a charge-transporting layer 500 between the two emission layers with a ratio of the two matrix materials of 50/50. It is clear that introducing the charge-transporting layer leads to an increase in the maximum in emission spectrum $B_1$ particularly in the red and green range (peaks between 500 and 700 nm), while in the blue range (approx. 450 nm) no difference is visible between spectrum $B_1$ and spectrum $B_0$ of the device without charge-transporting layer.

The emission spectrum $B_2$ in FIG. 6b shows the emission of a device with a charge-transporting layer, in which the ratio of hole-transporting matrix material to electron-transporting matrix material amounts to 70/30. Compared to the emission of device $B_1$, it is clear here that the peak in the blue range (approx. 450 nm) is raised, while the red and green emission (the range between 500 and 700 nm) falls in intensity. It can thus be demonstrated that it is possible, by varying the mixing ratios of the matrix materials in the charge-transporting layer, purposefully to adjust the overall emission colour.

A further improvement may be achieved by introducing a second charge-transporting layer 510 with two matrix materials between the green, second emission layer 410 and the red, third emission layer 420. In this way, the transfer of excitons from the green to the red emitter is suppressed. The emission efficiency of the green emitter rises, while at the same time the intensity of red emission falls slightly, which may be readily compensated by using a mixed matrix in the red emission layer. The ambipolar nature of the charge transport material once again ensures uniform charge carrier transport of both charge carrier types through all the layers. The overall efficiency of the device increases, since higher energy green excitons are not transferred into low energy red excitons with a release of energy (in the form of heat). Such a second charge-transporting layer 510 increases the overall efficiency of the component by 20% relative to a device without this charge-transporting layer, the proportion of green emission increasing by 40% while red emission falls by 10%. A further advantage of the second charge-transporting layer 510 with two matrix materials consists in the possibility of optimising radiance in the forwards direction for the individual emission layers independently of one another and without greatly influencing the colour of emission at the device, since the distances between the emission layers 400, 410 and 420 and the reflective first electrode 100 may be adjusted by means of the layer thicknesses of the charge-transporting layers 500, 510.

FIG. 7 shows the emission spectrum (radiance R plotted in W/srm²nm against wavelength λ in nm) of a device with a first charge-transporting layer 500 with two matrix materials between the green, second emission layer 410 and the blue, first emission layer 400 and a green emission layer, which likewise comprises two matrix materials. This device was operated at various luminance values, the spectra accordingly being designated $E_{2000}$ (operated at 2000 cd/m²), $E_{1m}$ (operated at 1000 cd/m²) and $E_{500}$ (operated at 500 cd/m²). It may be seen that, by increasing luminance, a colour shift towards red takes place (elevated peak maximum at approx. 600 nm), which leads however only to a change in colour temperature, the colour appearance of the overall emission remaining white.

Figure 8A:
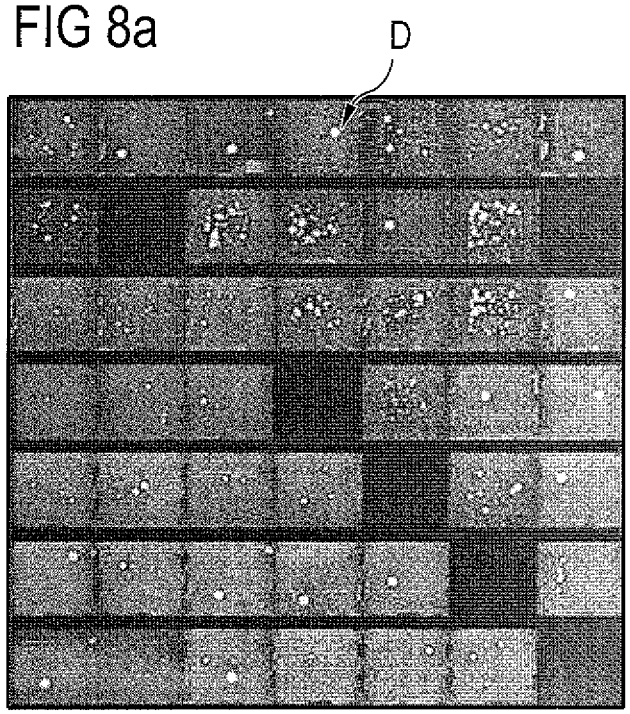
FIG. 8 shows photographs of radiation-emitting devices for various thicknesses (FIGS. 8*a* and 8*b*) of the second doped transport layer.
Figure 8B:
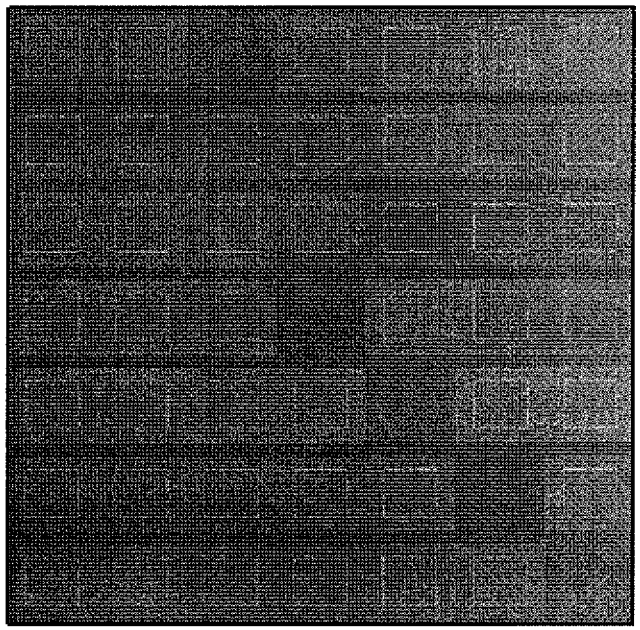

FIG. 8 shows photographs of a device in which a voltage of 4 V was applied in the reverse direction. FIG. 8a shows a device with a doped transport layer 210, in this case a hole transport layer, the thickness of which amounts to 20 nm, while in FIG. 8b the thickness of the hole transport layer amounts to 400 nm. The white spots in the left-hand figure show that, when the voltage is applied, short circuits D occur, such that the function of the device is turned off. When the layer thickness is increased, as is visible in FIG. 8b, any unevennesses on the anode, which lies below the hole transport layer, are covered over, such that the function of the radiation-emitting device is retained.

Figure 9A:
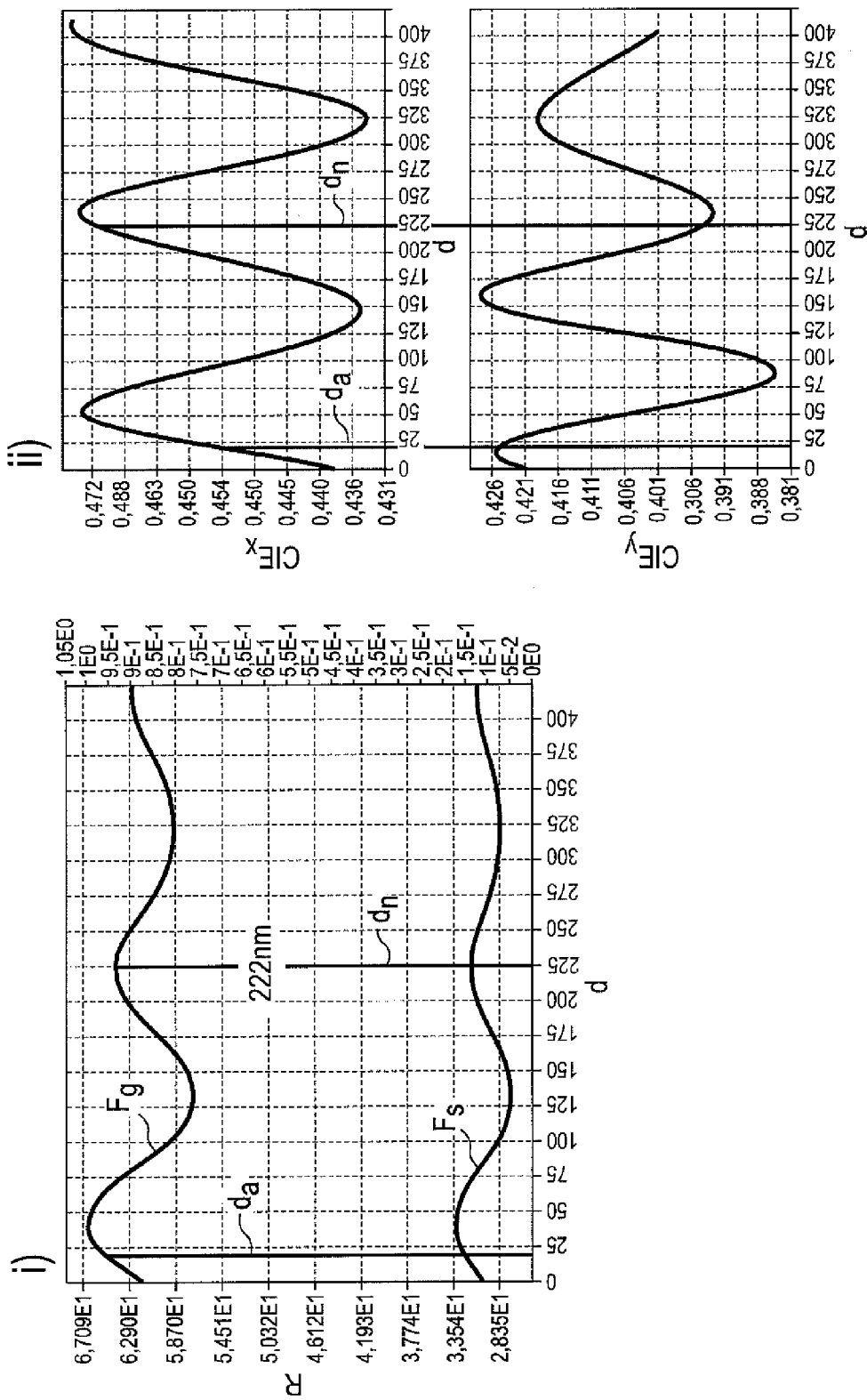
FIG. 9 shows simulated spectra of the luminance for various layer thicknesses of the electrode (FIGS. 9*a* and 9*b*).
Figure 9B:
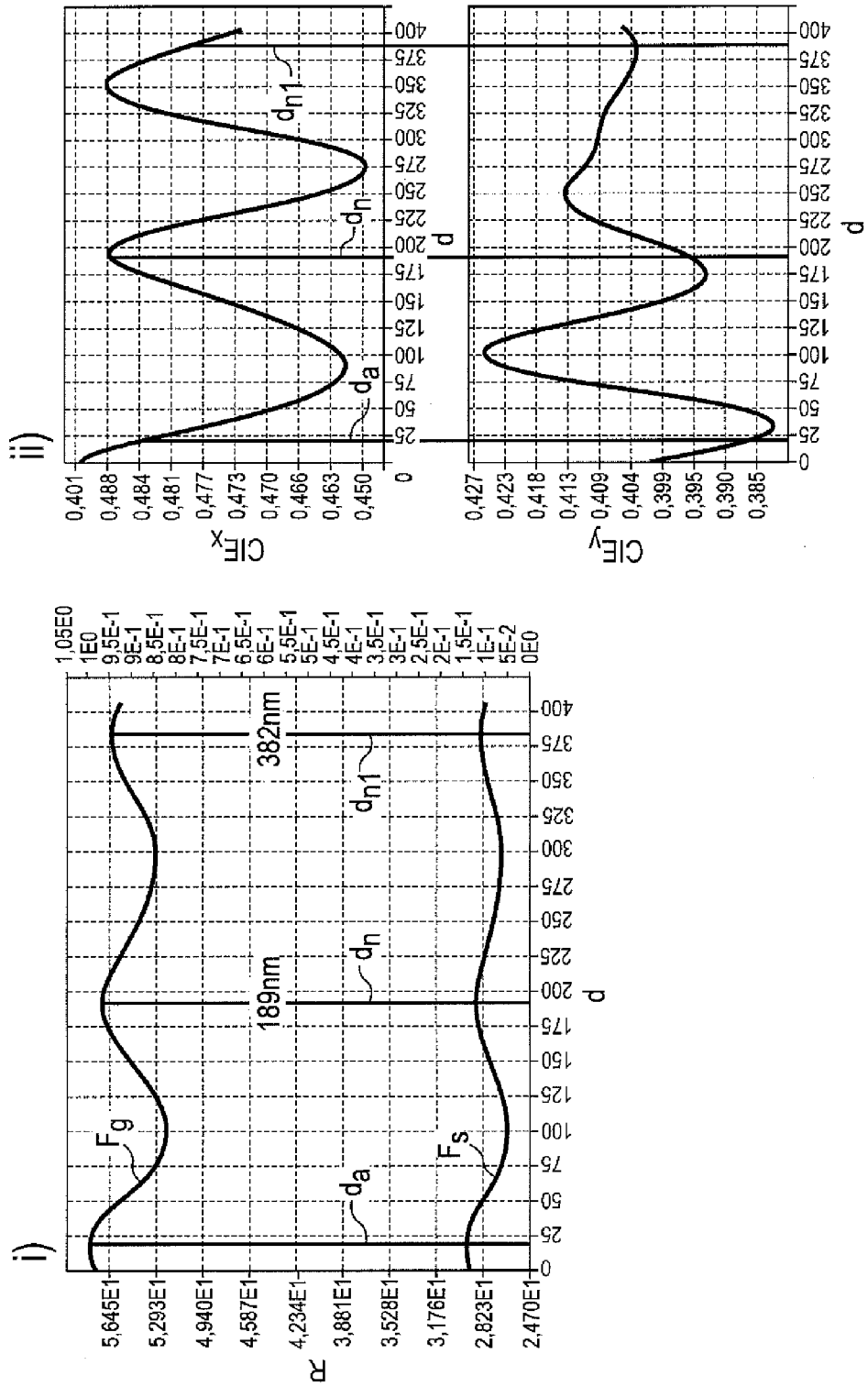

FIGS. 9a and 9b show simulation data for the radiance and the emission colours for the device as a function of layer thickness of the doped transport layer. In this exemplary embodiment the layer thickness of the hole transport layer is varied. FIG. 9a relates to a device with a 115 nm thick ITO anode on which the hole transport layer is arranged, while FIG. 9b relates to a device with a 160 nm thick ITO anode, on which the hole transport layer is arranged. In the spectra i), radiance R is in each case plotted in W/(srm²nm) against layer thickness d in nm. The simulated radiance $F_g$ is made up of the parallel and perpendicular electrical fields, so corresponding to overall emission. The simulated radiance $F_s$, which comprises only one direction, the s-polarised fraction of the electrical field, provides the same information. In the spectra ii) the x and y values of the 1931 CIE diagram, $CIE_x$ and $CIE_y$, are plotted against layer thickness d in nm. Both spectra i) and ii) show in each case a reference layer thickness $d_a$ of 20 nm and optimised layer thicknesses $d_n$ and $d_{n1}$.

FIG. 9a shows a simulation in which an optimised layer thickness $d_n$ of 222 nm was calculated. At this layer thickness a maximum is present in the simulated radiance $F_s$ or $F_g$, while quantum efficiency falls by only 5% as a result of the greater layer thickness. At the same time the $CIE_x$ and $CIE_y$ values shift by only +0.02 or –0.03 as a result of the change in layer thickness. Thus, the layer thickness of the hole transport layer may be increased, in order to envelope the unevennesses on the electrode, without the efficiency or colour location of the radiation-emitting device being substantially changed.

As in FIG. 9a, FIG. 9b shows two optimised layer thicknesses $d_n$ and $d_{n1}$ of 189 and 382 nm respectively at a maximum simulated radiance $F_s$ and $F_g$ respectively. Quantum efficiency falls by 1% if the layer thickness is changed from 20 nm to 189 nm and by 3% if the layer thickness if changed from 20 nm to 384 nm. The $CIE_x$ value changes simultaneously by +0.003 or 0.01 and the $CIE_y$ value by –0.03 or +0.02.

The simulations shown in FIGS. 9a and 9b likewise show that the total thickness of electrode and transport layer plays a part with regard to quantum efficiency and colour location of the overall emission.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed:

1. A radiation-emitting device, comprising:
 a first electrode to emit charge carriers of a first charge when in operation;
 a first doped transport layer on the first electrode to transport the charge carriers of the first charge, the first doped transport layer having a doping gradient;
 a first emission layer comprising a first emitter material, the first emission layer being arranged on the first doped transport layer;
 a second emission layer comprising a second emitter material, the second emission layer being arranged on the first emission layer; and
 a second electrode to emit charge carriers of a second charge when in operation, the second electrode being arranged on the second emission layer;
 wherein the first and/or second emitter material is phosphorescent and the first emitter material emits radiation at a different wavelength from the second emitter material.

2. The device according to claim 1, wherein a first charge-transporting layer is arranged between the first emission layer and the second emission layer.

3. The device according to claim 2, wherein the first charge-transporting layer comprises a matrix including a matrix material to transport charge carriers of the first and second charges.

4. The device according to claim 1, further comprising a third emission layer having a third emitter material, the third emission layer being between the second emission layer and the second electrode, wherein the third emitter material emits radiation at a different wavelength than the first and second emitter materials.

5. The device according to the claim 4, wherein the third emission layer transports charge carriers of the second charge.

6. The device according to claim 4, further comprising a second charge-transporting layer between the second and third emission layers.

7. The device according to claim 6, wherein the second charge-transporting layer comprises a matrix including a matrix material to transport charge carriers of the first and second charges.

8. The device according to claim 4, wherein the first, second, and/or third emission layer comprises a matrix, including a matrix material to transport charge carriers of the first and second charges.

9. The device according to claim 1, wherein the first electrode reflects radiation emitted by the first and/or second emitter materials.

10. The device according to claim 4, wherein the first electrode reflects the radiation emitted by the first, second, and/or third emitter materials.

11. The device according to claim 9, wherein, as the distance between the emission layers and the first electrode increases, the respective emitter materials emit radiation of a greater wavelength.

12. The device according to claim 1, wherein the second electrode is transparent to the radiation emitted by the first and/or second emitter materials.

13. The device according to claim 4, wherein the second electrode is transparent to the radiation emitted by the first, second, and/or third emitter materials.

14. The device according to claim 1, wherein the surfaces of the first and/or second electrodes facing the first and/or second emission layers, respectively, exhibit unevennesses of a specific height.

15. The device according to claim 14, wherein the first doped transport layer adjoining the first electrode and/or the second emission layer adjoining the second electrode have respective thicknesses greater than the height of the unevennesses.

16. The device according to claim 2, wherein the first charge transporting layer comprises a mixture of:
 a first matrix material to transport charge carriers of the first charge; and
 a second matrix material to transport charge carrier of the second charge.

17. The device according to claim 6 wherein the first charge transporting layer comprises a mixture of:
 a first matrix material to transport charge carriers of the first charge; and
 a second matrix material to transport charge carrier of the second charge.

18. The device according to claim 4, wherein the first, second, and/or third emission layers comprise a matrix including a mixture of:
 a first matrix material to transport charge carriers of the first charge; and
 a second matrix material to transport charge carriers of the second charge.

* * * * *